United States Patent
Xu et al.

(10) Patent No.: US 11,383,940 B2
(45) Date of Patent: Jul. 12, 2022

(54) ROBOT ARM FOR HOLDING CASSETTE AND AUTOMATIC CASSETTE TRANSFER DEVICE

(71) Applicant: SHANGHAI MICRO ELECTRONICS EQUIPMENT (GROUP) CO., LTD., Shanghai (CN)

(72) Inventors: Qixin Xu, Shanghai (CN); Rong Du, Shanghai (CN); Lingyu Li, Shanghai (CN)

(73) Assignee: SHANGHAI MICRO ELECTRONICS EQUIPMENT (GROUP) CO., LTD., Shanghai (CN)

(*) Notice: Subject to any disclaimer, the term of this patent is extended or adjusted under 35 U.S.C. 154(b) by 927 days.

(21) Appl. No.: 16/097,550

(22) PCT Filed: Apr. 28, 2017

(86) PCT No.: PCT/CN2017/082506
§ 371 (c)(1),
(2) Date: Oct. 29, 2018

(87) PCT Pub. No.: WO2017/186172
PCT Pub. Date: Nov. 2, 2017

(65) Prior Publication Data
US 2019/0152721 A1    May 23, 2019

(30) Foreign Application Priority Data
Apr. 29, 2016 (CN) .......................... 201610285759.8

(51) Int. Cl.
| | | |
|---|---|---|
| *B65G 47/90* | (2006.01) | |
| *H01L 21/677* | (2006.01) | |
| *H01L 21/687* | (2006.01) | |
| *B25J 9/16* | (2006.01) | |
| *H01L 21/673* | (2006.01) | |
| *H01L 21/68* | (2006.01) | |

(52) U.S. Cl.
CPC .......... *B65G 47/905* (2013.01); *B25J 9/1697* (2013.01); *H01L 21/6735* (2013.01);
(Continued)

(58) Field of Classification Search
CPC ... H01L 21/681; H01L 21/68; H01L 21/6773; H01L 21/67742; H01L 21/67733;
(Continued)

(56) References Cited

U.S. PATENT DOCUMENTS 7,611,318 B2 * 11/2009 Rice .................. H01L 21/67733
414/217.1
7,684,895 B2 * 3/2010 Rice .................. H01L 21/67769
348/97
(Continued)

FOREIGN PATENT DOCUMENTS

| CN | 1611331 A | 5/2005 |
|---|---|---|
| CN | 1668424 A | 9/2005 |

(Continued)

*Primary Examiner* — Alia Sabur
(74) *Attorney, Agent, or Firm* — Muncy, Geissler, Olds & Lowe, P.C.

(57) ABSTRACT

A robotic manipulator for handling a cassette and an automated cassette transport device are disclosed, the device including a mechanical arm (1), an end actuator (2) at an end of the mechanical arm (1) and a vision-based locating assembly (3) on the end actuator (2). On the one hand, the vision-based locating assembly (3) can determine the position of a flange of the cassette, thereby identifying the cassette. In other words, the cassette can be identified based on a feature of the cassette itself. This dispense with a separate locating marker while improving cassette measuring and handling accuracy. On the other hand, transportation of the cassette is allowed by complementary retention of its flange on a recessed surface of the end actuator (2).

13 Claims, 3 Drawing Sheets

(52) U.S. Cl.
CPC .... *H01L 21/6773* (2013.01); *H01L 21/67724* (2013.01); *H01L 21/67775* (2013.01); *H01L 21/681* (2013.01); *H01L 21/68707* (2013.01); *B65G 2201/0297* (2013.01); *H01L 21/67379* (2013.01)

(58) Field of Classification Search
CPC .. B25J 15/0095; B25J 15/009; B25J 15/0014; B65G 2201/0297; B66C 17/04
See application file for complete search history.

(56) References Cited

U.S. PATENT DOCUMENTS

| | | | | |
|---|---|---|---|---|
| 2003/0110649 | A1* | 6/2003 | Hudgens | H01L 21/67259 33/286 |
| 2003/0198376 | A1 | 10/2003 | Sadighi et al. | |
| 2010/0271229 | A1* | 10/2010 | Allen-Blanchette | H01L 21/681 340/815.4 |

FOREIGN PATENT DOCUMENTS

| | | | |
|---|---|---|---|
| CN | 1733579 | A | 2/2006 |
| CN | 1759478 | A | 4/2006 |
| CN | 1891591 | A | 1/2007 |
| CN | 102027568 | A | 4/2011 |
| CN | ON 104626147 | A | 5/2015 |
| CN | 104854690 | A | 8/2015 |
| CN | 104858854 | A | 8/2015 |
| CN | 105143075 | A | 12/2015 |
| CN | 105252516 | A | 1/2016 |
| JP | S-62240226 | A | 10/1987 |
| JP | H-05146984 | A | 6/1993 |
| JP | 2001203251 | A | 7/2001 |
| JP | 2001298069 | A | 10/2001 |
| JP | 2004363363 | A * | 12/2004 |
| JP | 2006066893 | A | 3/2006 |
| JP | 2006332460 | A | 12/2006 |
| JP | 2008177238 | A | 7/2008 |
| JP | 5573948 | B2 * | 8/2014 ............ B65G 43/00 |
| KR | 20010090477 | A | 10/2001 |
| KR | 20040101540 | A | 12/2004 |
| KR | 20130125158 | A | 11/2013 |

* cited by examiner

ROBOT ARM FOR HOLDING CASSETTE AND AUTOMATIC CASSETTE TRANSFER DEVICE

TECHNICAL FIELD

The present invention relates to the field of mechanics and, in particular, to a robotic manipulator for handling cassette and an automated cassette transport device.

BACKGROUND

Since the advent of the 21st century, automated logistics systems have been widely used in various industrial applications. In the integrated circuit (IC) industry, automated material handling systems (AMHSs), including stocker, overhead hoist transfer (OHT) or automatic guided vehicle (AGV), have found extensive use in production lines in front-end semiconductor fabrication plants (fabs), in particular in 12-inch lines. In such an AMHS, for example, wafer cassettes are directly transported, as scheduled by a manufacturing execution system (MES) system, from the stocker to load ports of various pieces of process equipment for automated production. This fades out the previous low-efficiency manual handling, greatly improves the automation of advanced IC production lines, significantly saves labor costs and increases product output and customer value.

At present, OHT systems are being used mainly for material handling in 12" production lines for front-end processes globally but not in back-end packaging lines despite their similar needs for automated material handling. With the increasing prevalence of 12" products, back-end fab workers are increasingly frequently faced with the need for handling 12" cassettes which weigh about 7.5 kg when fully loaded. This job is strenuous and somehow risky. This, coupled with the predicted trend of increasing labor shortage and cost, gives rise to a growing demand for cassette transport robots. However, due to limitations in production scale and profit, most packaging manufacturers could not afford the investment in OHT systems as the front-end semiconductor manufacturers do. Therefore, there is an urgent need in the art to develop a convenient, cost-efficient automatic cassette transport solution and equipment.

Globally, some electronics and semiconductor plants have replaced manual handling with AGVs in their production lines. Although these transport robots can save a lot of manual labor, most of them can handle only 8" cassettes but not 12" ones.

Existing 12" cassette transport devices are low in efficiency because they can carry only one cassette per trip. Moreover, the cassette pickup operation of the cassette transport devices is usually not adaptive to ordinary stock shelves. This is because such a 12" cassette transport device has a long robotic arm which requires a large operating space. On the contrary, in order to achieve a maximum storage capacity and intra-fab free space, most stock shelves installed in current fabs are designed as tri-layered structures with an interlayer spacing not exceeding 450 mm. For an automated 12" cassette transport device, it leaves a narrow space for the long robotic arm to fetch cassettes therefrom.

Further, cassette location identification plays a key role in ensuring correct cassette handling of the aforesaid automated cassette transport devices. Currently, such identification is essentially accomplished in either of the following two approaches. In the first approach, an OHT system is employed, in which an OHT shuttle is loaded with a cassette from the stocker and then follows a track to approach a load port of the target process equipment. When it is located over the port, the cassette is lowered thereon by a rope. This process is so established that the location of the cassette in the stocker relative to other locations therein is taught by a robotic arm of the stocker and the location thereof in the OHT shuttle can be known from the track and the involved locating mechanical elements. In addition, the discrimination of the target load port, on which the cassette is to be placed by the OHT shuttle, from other load ports is enabled also by the track as well as by the process equipment layout.

In the second approach, photo-detectors for reading markers attached to the shelves are used to identify a target cassette. This solution, however, suffers from the following two drawbacks:

1. Locating accuracy of the markers degrades over time, which may finally lead to incorrect cassette pickups.
2. The markers must be deployed relative to cassette trays with sufficient locating accuracy, which increases the cost of manufacturing the shelves.

SUMMARY OF THE INVENTION

The present invention seeks to overcome the drawbacks of the conventional automated cassette transport devices by proposing a cassette handling robotic manipulator and a novel automated cassette transport device.

To this end, the proposed cassette handling robotic manipulator includes a mechanical arm, an end actuator at an end of the mechanical arm and a vision-based locating assembly on the end actuator, wherein the vision-based locating assembly is configured to obtain a position of a flange on a top of the cassette, and wherein the end actuator includes a recessed surface complementary to the flange on the top of the cassette, and the end actuator is configured to hold the flange on the top of the cassette by the recessed surface based on the position of the flange.

Optionally, in the cassette handling robotic manipulator, the vision-based locating assembly may include: a horizontal locating member and a vertical locating member, the horizontal locating member being configured for capturing a horizontal feature of a surface of the cassette, the vertical locating member being configured for capturing a vertical feature of the surface of the cassette, and wherein the position of the flange is determined based on the horizontal and vertical features of the surface of the cassette.

Optionally, in the cassette handling robotic manipulator, the horizontal locating member may include a first camera facing toward either lateral side of the end actuator.

Optionally, in the cassette handling robotic manipulator, the vertical locating member may include a second camera and a reflector, both disposed on a lateral side of the end actuator.

Optionally, in the cassette handling robotic manipulator, the end actuator may be a C-shaped semi-closed structure with support plates arranged on two lateral sides of the semi-closed structure.

Optionally, in the cassette handling robotic manipulator, the end actuator may further include shoulders that are provided along a front side of the recessed surface to prevent accidental drop-off of the cassette.

Optionally, in the cassette handling robotic manipulator, at least one presence sensor may be provided on the recessed surface to sense whether the cassette is held by the recessed surface.

Optionally, the cassette handling robotic manipulator may further include a sonar sensor that is disposed on the end actuator to ensure safety during transportation of the cassette.

Optionally, in the cassette handling robotic manipulator, at least two locating pins may be arranged on the recessed surface, each being configured to mate with a corresponding one of notches of the flange.

Optionally, in the cassette handling robotic manipulator, the end actuator may define an inverted-L shape together with the end portion of the mechanical arm.

Optionally, in the cassette handling robotic manipulator, the end actuator may be 360-degree rotatable at the end of the mechanical arm.

Optionally, in the cassette handling robotic manipulator, the mechanical arm may be movable in six degrees of freedom.

The above object is also attained by the proposed automated cassette transport device which includes: an automatic guided vehicle (AGV); a carrier frame mounted on the AGV; and the cassette handling robotic manipulator as defined above, which is disposed on the carrier frame.

Optionally, the automated cassette transport device may further include cassette carriers disposed on the carrier frame, wherein the robotic manipulator is located at a corner of the carrier frame relative to the cassette carriers.

In the cassette handling robotic manipulator of the present invention including the mechanical arm, the end actuator at an end of the mechanical arm and the vision-based locating assembly on the end actuator, the vision-based locating assembly identifies a cassette by locating a top flange thereof, i.e., identify the cassette based on a feature of its own, without needing a separate locating marker. This leads to improvements in both cassette measuring and handling accuracy. Moreover, transportation of the cassette is enabled by complementary retention of its top flange on a recessed surface of the end actuator. Further, the retention of the top flange on the recessed surface can concur with mating between locating pins on the recessed surface and notches in the top flange, which allows self-centering of the cassette, thereby achieving an additional improvement in locating accuracy.

In these figures, 1—mechanical arm; 2—end actuator; 20—support plate; 21—recessed surface; 22—shoulder; 23—presence sensor; 24—sonar sensor; 25—locating pin; 3—vision-based locating assembly; 30—horizontal locating member; 300—first camera; 31—vertical locating member; 310—second camera; 311—reflector; 40—flange; 5—carrier frame.

DETAILED DESCRIPTION OF PREFERRED EMBODIMENTS

The cassette handling robotic manipulator and automated cassette transport device proposed in the present invention will be further described with reference to the following detailed description of several particular embodiments thereof, which is to be read in connection with the accompanying drawings. Features and advantages of the invention will be more apparent from the following detailed description, and from the appended claims. It is noted that the figures are provided in a very simplified form and not necessarily drawn to scale, with the only intention to facilitate convenience and clarity in explaining the embodiments.

Figure 1:
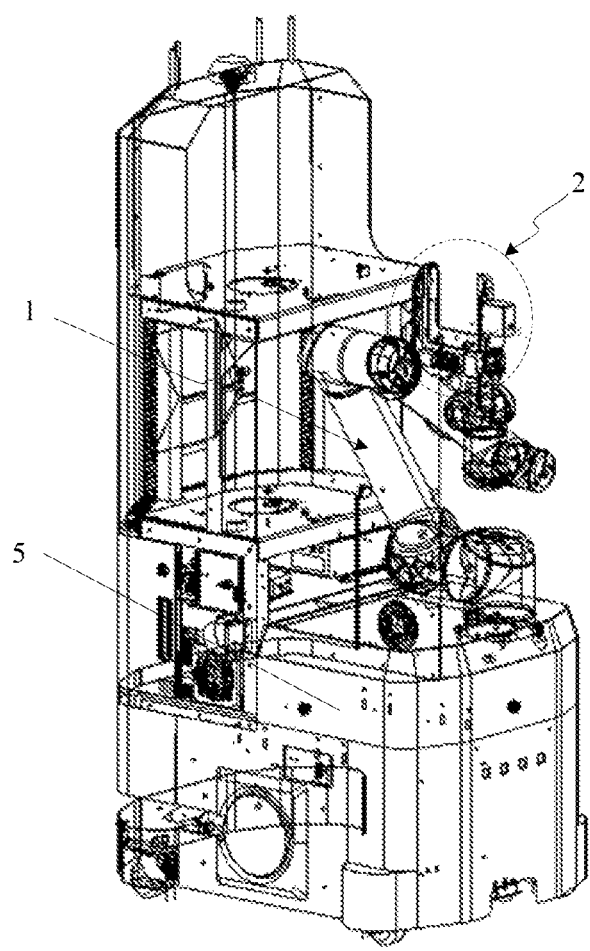
FIG. 1 is a schematic view of an automated cassette transport device according to one embodiment of the present invention.

Reference is now made to FIG. 1, a schematic view of an automated cassette transport device constructed in accordance with the present invention. As shown in FIG. 1, the automated cassette transport device includes: an automatic guided vehicle (AGV); a carrier frame 5 mounted on the AGV; a robotic manipulator disposed on the carrier frame 5 for handling the cassettes; and cassette carriers disposed on the carrier frame 5. The robotic manipulator may be arranged at a corner of the carrier frame 5 relative to the cassette carriers. Preferably, the number of the cassette carriers is two, which are positioned one above the other.

Figure 2:
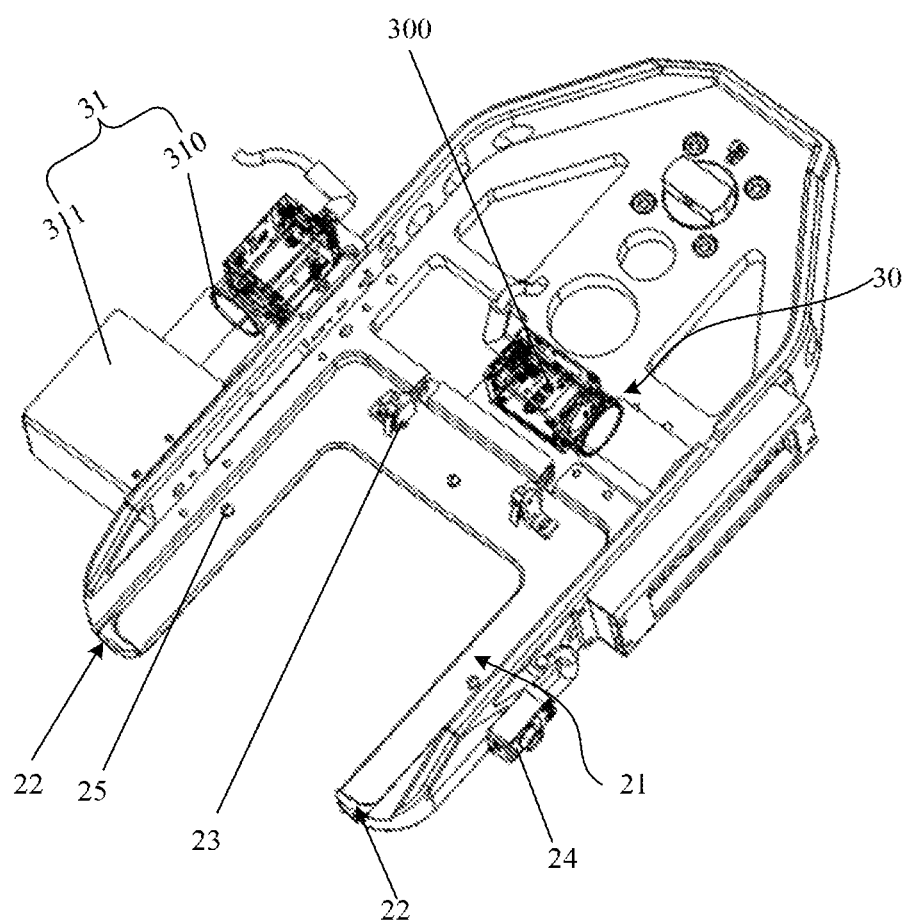
FIG. 2 is a schematic view of an end actuator according to one embodiment of the present invention.
Figure 3:
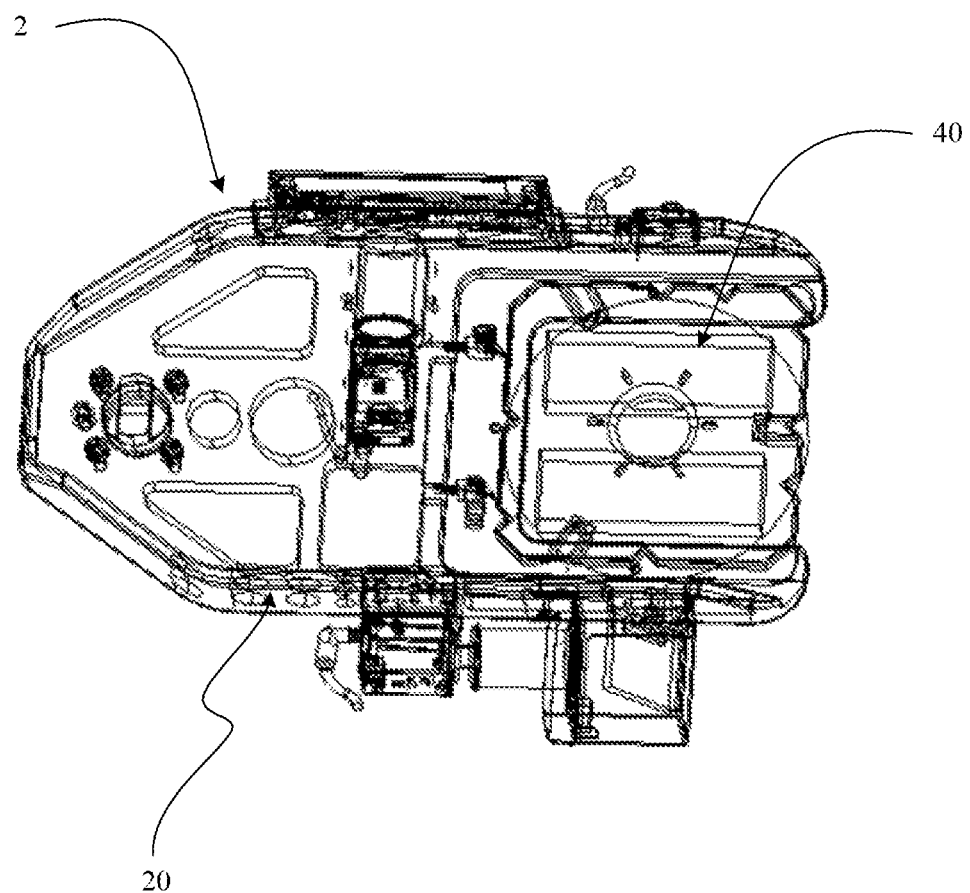
FIG. 3 is a schematic view illustrating the retention of a flange of a cassette on a recessed surface of the end actuator according to one embodiment of the present invention.

Referring to FIGS. 2 and 3, according to one embodiment, the robotic manipulator essentially includes: a mechanical arm 1; an end actuator 2 at one end of the mechanical arm 1; and a vision-based locating assembly disposed on the end actuator 2. The vision-based locating assembly is used for obtaining a position of a flange 40 on the top of a cassette (the flange being a feature of the cassette itself). The end actuator 2 includes a recessed surface 21 complementary to the flange 40 on the top of the cassette. The end actuator 2 is configured to hold the flange 40 on the top of the cassette by means of the recessed surface 21 based on the obtained position of the flange 40 of the cassette. The position of the flange 40 of the cassette obtained by the vision-based locating assembly accomplishes identification of the cassette. Since each cassette has a fixed size, the location where the cassette is retained can be known once the position of the flange 40 of the cassette is obtained. This dispenses with the need for a separate locating marker while improving measuring and handling accuracy. Transportation of the cassette may follow by the end actuator 2, in particular, by the retention of the flange 40 of the cassette on the recessed surface 21 of the end actuator 2. Therefore, the flange 40 of the cassette is not only capable of identification but also can assist the end actuator 2 in transporting the cassette.

With reference to FIGS. 1 and 3, in a particular process of transporting the cassette, the robotic manipulator may hold the cassette by inserting the end actuator 2 into a space between the flange 40 on the top of the cassette and the main body of the cassette to a proper position and then vertically lift the cassette. After the cassette is put in place in the automated cassette transport device, the end actuator 2 may be lowered to detach itself from the cassette and then be withdrawn. Preferably, the mechanical arm 1 in the robotic manipulator is movable in six degrees of freedom, and the end actuator 2 is 360-degree rotatable at the end of the mechanical arm 1. In operation, the end actuator 2 may be oriented to define an inverted-L shape together with the end section of the mechanical arm 1. Specifically, with the end actuator 2 being inserted in the stock shelf, an adjacent end section of the mechanical arm 1 may be located under the end actuator 2. In this way, loss of free space in the room where the cassette is contained (e.g., the shelf, the cassette carrier, etc.) resulting from the insertion of the end actuator 2 can be minimized, and the end of the mechanical arm 1 will experience a reduced torque.

According to one embodiment, at least two locating pins 25 are provided on the recessed surface 21. The locating pins 25 can mate with corresponding notches in the flange 40. The notches of the flange 40 may be triangular or circular, and the locating pins 25 are complementary to the notches of the flange 40 on the top of the cassette in terms of both position and shape. While the locating pins 25 have been described above as being cross-sectionally triangular or circular, the present invention is not so limited because the locating pins 25 may have any cross-sectional shape as long as they can be received in the notches of the flange 40, with the geometric centers of the locating pins 25 coinciding with those of the notches. When the notches of the flange 40 mate with the locating pins 25 on the recessed surface 21, the retained cassette will be self-centered, resulting in an additional improvement in locating accuracy of the cassette. Holding the cassette on the end actuator 2 with precisely controlled positional accuracy is helpful in correct placement of the cassette onto the transport vehicle.

As shown in FIG. 3, the end actuator works in a passive mode. The end actuator 2 may be a C-shaped semi-closed structure with support plates 20 on both sides. The C-shaped semi-closed structure can provide a function like the cables in a cable-stayed bridge. As shown in FIG. 2, the vision-based locating assembly may include a horizontal locating member 30 and a vertical locating member 31. The horizontal locating member 30 is used for capturing a horizontal feature of the surface of the cassette; and the vertical locating member is used for capturing a vertical feature of the surface of the cassette. The position of the flange 40 of the cassette, i.e., the exact spatial position of the flange 40, can be determined based on the horizontal and vertical features to serve a basis for subsequent accurate cassette retention and transportation by the end actuator 2.

The horizontal locating member 30 may include a first camera 300. The first camera 300 is disposed at a center of the end actuator 2. The first camera 300 has a lens facing toward either one of the support plates 20 of the end actuator 2. The vertical locating member 31 may include a second camera 310 and a reflector 311. The second camera 310 and the reflector 311 are both disposed on the other one of the support plates 20 than the one toward which the lens of the first camera 300 faces, as well as on a proximal lateral side of the end actuator 2. With this arrangement, the distance between the second camera 310 and the flange 40 of a target cassette can be minimized to facilitate a measurement of the flange 40 of the target cassette, with the end actuator 2 being inserted within the room where the cassette is retained.

Figure 4:
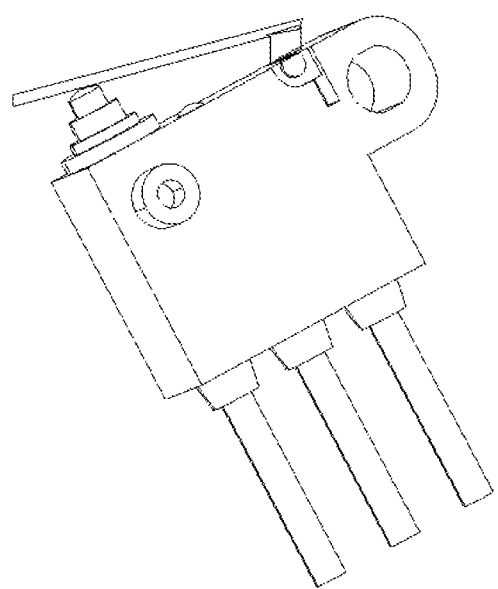
FIG. 4 is a schematic view of a presence sensor according to one embodiment of the present invention.

The end actuator 2 may further include shoulders 22 and at least one presence sensor 23. The shoulders 22 are provided along a front side of the recessed surface 21 in order to avoid drop-off of the cassette upon sudden power-off of the robotic manipulator. The at least one presence sensor 23 is arranged on the recessed surface 21, preferably in an area coming into contact with the flange 40, in order to sense whether the cassette is held on the recessed surface 21. Preferably, the presence sensor 23 may include a mechanical switching element, as shown in FIG. 4, which will be triggered to, once the cassette is self-centered, raise a signal indicating the presence of the cassette.

In a preferred embodiment, the robotic manipulator further includes a sonar sensor 24 disposed on either one of the support plates 20 of the end actuator 2. Once any object is detected to be within a threshold detection range of the sonar sensor during cassette transportation, the mechanical arm 1 may be immediately deactivated so as to ensure safety.

Vertical laser sensors may be further arranged on sides of the carrier frame 5 to enable vertical obstacle detection for the automated cassette transport device.

A process of fetching a cassette from a storage shelf by the automated cassette transport device as defined above may essentially include:

determining parking positions for various layers of the shelf; performing a horizontal measurement of the notches of the flange 40 using the first camera 300; obtaining positions of the cassette in the X-, Y-, Z- and Rx-directions from horizontal features of the notches of the flange 40; bringing the second camera 310 above the notches of the flange 40 and obtaining X-, Y- and Rz-directional positions of the cassette from vertical features of the notches; and holding the cassette by the end actuator from under the flange 40 on the top of the cassette.

The present invention also provides a cassette transport system incorporating the automated cassette transport device as defined above. The cassette transport system can perform the following operations:

1) Remote Scheduling: A controller of the cassette transport system issues a cassette transfer task and provides associated information indicating the ID of the cassette to be transferred, start and destination points, etc. A scheduling server performs optimal scheduling based on the positions and usage states of all automated cassette transport devices in the fab to select the most suitable one for the task and informs its AGV of all the information necessary for fulfilling the task, including the cassette ID and the start and destination points.

2) Movement to Target Positions: The AGV of the automated cassette transport device calculates an optimal path based on the coordinates of its current and target positions and follows the path to reach the start point where the target cassette is accessible. During the movement, it can autonomously avoid any obstacle in the path. Upon the arrival, the AGV adjusts its own orientation to allow the mechanical arm to hold the cassette (from the shelf or the process equipment) so as to get ready for transportation.

3) Cassette Transportation: the task may include either removal of the cassette from shelf/process equipment or placement thereof onto the shelf/process equipment. The removal may be accomplished by the following steps:

a) The automated transport device moves to a parking position in the vicinity of the load port of the process equipment/shelf. Assuming the shelf is a tri-layered structure having three layers of different heights, hereinafter referred to as a top layer, a middle layer and a bottom layer, the parking position may vary with the layer where the cassette is stored, in order to ensure operational reliability of the automated transport device. For example, in case of the cassette being stored on the top layer higher than the robotic manipulator, leaving a large space for the operation thereof, the parking position may be close to the shelf, e.g., about 100 mm away therefrom, in order to minimize a stretched length of the robotic manipulator to reduce the possibility of tip over of the transport device due to a torque generated when the cassette is load. In addition, motion of the robotic manipulator should be designed to avoid collisions or inadvertent harassment. If the cassette is stored on the bottom layer that is nearly as high as the robotic manipulator, the parking position may be farther from the shelf, e.g., about 400 mm away therefrom. In this case, as the operating space for the robotic manipulator is reduced, motion of the robotic manipulator should be properly designed to avoid collisions or inadvertent harassment. For the case in which the cassette is located on the middle layer, the parking position may be between those for the two cases discussed above, and the avoidance of collisions or inadvertent harassment should also be taken into account.

b) The first camera 300, and hence the sonar sensor 24, is turned laterally, by the end actuator to face toward the target cassette. The first camera 300 measures the X-directional distance X between the flange 40 of the cassette and the first camera 300. Specifically, assuming the lens of the first camera 300 has a magnification $$M = \frac{\text{Image Size}}{\text{Object Size}}$$

and a focal length f, X can be obtained as $$X = f * \left(\frac{1}{M} + 1\right).$$

c) Image processing may then be carried out to determine the positions of the notches of flange 40, from which a Y-directional distance from the flange 40 to the first camera 300 can be obtained. The notches may be identified using a contour or gray scale based library matching algorithm, matching based on corner points and descriptors, a linear detection based algorithm or the like.

d) Based on the X- and Y-directional distances from the flange 40 to the first camera 300, a Z-directional distance and Rx-directional rotation between the flange 40 and the first camera 300 may be calculated using a Hough transform or a similar linear detection based algorithm.

e) Based on the measured X-, Y-, Z- and Rx-directional positions of the flange 40 of the cassette relative to the first camera 300, the robotic manipulator brings the second camera 310 above the notches of the flange 40 on the top of the cassette.

f) Image processing may be performed to determine the positions of more than two notches of the flange 40, from which, along with the nominal dimensions of the flange 40 itself, X-, Y- and Rz-directional positions of the flange 40 relative to the second camera 310 can be calculated.

g) Based on the X-, Y- and Rz-directional positions of the flange 40 relative to the second camera 310, the end actuator 2 is inserted under the flange to a proper position allowing notches therein to mate with the locating pins 25 on the end actuator 2. The cassette is then lifted by the end actuator 2 and self-centered, triggering the mechanical switching element in the cassette presence sensor to inform the controller of the automated cassette transport device of the presence of the cassette.

h) The controller of the automated cassette transport device dictates the mechanical arm to follow a certain motion trajectory to put the cassette held by the end actuator in place onto a cassette carrier in the device itself. The trajectory should not go beyond a widthwise projected space of the AGV. The placement may result from slow lowering of the robotic manipulator.

i) After the cassette is put in place, an RFID sensor may read information of the cassette and record data about the whole cassette transport process, followed by feedback of the data to the cassette transport system.

j) The automated cassette transport device waits for the next task in a predefined sequence of tasks.

4) Cassette Shelve: This operation may be accomplished by the following steps:

a) The automated transport device moves to a target parking position. This step is similar to the above step a) and will not be further detailed for the sake of simplicity.

b) The vision-based locating assembly of the end actuator is laterally turned to face toward the shelf (in particular, to a facial datum plane for the cassette).

c) The mechanical arm brings the vision-based locating assembly above a cassette tray on the load port of the process equipment/shelf, onto which the cassette is to be placed. Features of the cassette tray (e.g., locating pins on the load port of standard process equipment) are then captured to determine its center. A target position at which the cassette is to be placed is then determined based on the center of the features as well as a center of the cassette held by the automated cassette transport device or a center of the locating pins thereon that lock the cassette.

d) From positions of the aforesaid features relative to the vision-based locating assembly, X-, Y-, Z- and Rz-directional offsets from the vision-based locating assembly to the center of the features are obtained, based on which the distance of the end actuator of the mechanical arm from the target position is in turn obtained.

e) Based on the determined target position for the cassette, the end actuator is inserted below the flange 40 on the top of the cassette and lifts the cassette, thus detaching it from the locating pins (consequently, the cassette can be moved in the X or Y direction).

f) Based on the obtained distance, the mechanical arm follows a certain motion trajectory to put in place the cassette onto the cassette tray on the load port of the process equipment/shelf. The trajectory should be within a projected not go beyond a projected space of a base.

g) During the movement of the mechanical arm, lateral sonars equipped on both sides of the base are activated to sense whether there is an approaching person. If this happens, the mechanical arm is slowed down and gives out an alert to prompt the person to step away from the operation site.

h) The placement may result from slow lowering of the robotic manipulator.

i) After the cassette is put in place, data about the whole process are recorded.

j) The recorded data are fed back to the cassette transport system.

k) The automated cassette transport device waits for the next task in a predefined sequence of tasks.

In summary, in the cassette handling robotic manipulator of the present invention including the mechanical arm, the end actuator at an end of the mechanical arm and the vision-based locating assembly on the end actuator, the vision-based locating assembly identifies a cassette by locating a flange thereof, i.e., identify the cassette based on a feature of its own, without needing a separate locating marker. This leads to improvements in both cassette measuring and handling accuracy. Moreover, transportation of the cassette is enabled by complementary retention of its flange on a recessed surface of the end actuator. Further, the retention of the flange on the recessed surface can concur with mating between locating pins on the recessed surface and notches in the top flange, which allows self-centering of the cassette, thereby achieving an additional improvement in locating accuracy.

The description presented above is merely that of a few preferred embodiments of the present invention and does not limit the scope thereof in any sense. Any and all changes and modifications made by those of ordinary skill in the art based on the above teachings fall within the scope as defined in the appended claims.

What is claimed is:

1. A robotic manipulator for handling a cassette, comprising a mechanical arm, an end actuator at an end of the mechanical arm and a vision-based locating assembly on the end actuator,
wherein the vision-based locating assembly is configured to obtain a position of a flange on a top of the cassette, and
wherein the end actuator comprises a recessed surface complementary to the flange on the top of the cassette, and the end actuator is configured to hold the flange on the top of the cassette by the recessed surface based on the position of the flange, wherein the end actuator is a C-shaped semi-closed structure with support plates arranged on two lateral sides of the semi-closed structure.

2. The robotic manipulator for handling a cassette of claim 1, wherein the vision-based locating assembly comprises a horizontal locating member and a vertical locating member, the horizontal locating member being configured for capturing a horizontal feature of a surface of the cassette, the vertical locating member being configured for capturing a vertical feature of the surface of the cassette, and wherein the position of the flange is determined based on the horizontal and vertical features of the surface of the cassette.

3. The robotic manipulator for handling a cassette of claim 2, wherein the horizontal locating member comprise a first camera facing toward either lateral side of the end actuator.

4. The robotic manipulator for handling a cassette of claim 2, wherein the vertical locating member comprise a second camera and a reflector, both disposed on a lateral side of the end actuator.

5. The robotic manipulator for handling a cassette of claim 1, wherein the end actuator further comprises shoulders that are provided along a front side of the recessed surface to prevent accidental drop-off of the cassette.

6. The robotic manipulator for handling a cassette of claim 1, wherein at least one presence sensor is provided on the recessed surface to sense whether the cassette is held by the recessed surface.

7. The robotic manipulator for handling a cassette of claim 1, further comprising a sonar sensor that is disposed on the end actuator to ensure safety during transportation of the cassette.

8. The robotic manipulator for handling a cassette of claim 1, wherein at least two locating pins are arranged on the recessed surface, each being configured to mate with a corresponding one of notches of the flange.

9. The robotic manipulator for handling a cassette of claim 1, wherein the end actuator is capable of forming an inverted-L shape together with the end of the mechanical arm.

10. The robotic manipulator for handling a cassette of claim 1, wherein the end actuator is 360-degree rotatable at the end of the mechanical arm.

11. The robotic manipulator for handling a cassette of claim 1, wherein the mechanical arm is movable in six degrees of freedom.

12. An automated cassette transport device, comprising an automatic guided vehicle; a carrier frame mounted on the automatic guided vehicle; and the robotic manipulator for handling a cassette of claim 1, which is disposed on the carrier frame.

13. The automated cassette transport device of claim 12, further comprising cassette carriers disposed on the carrier frame, wherein the robotic manipulator is located at a corner of the carrier frame relative to the cassette carriers.

* * * * *